US009583530B2

(12) United States Patent
Tsuji et al.

(10) Patent No.: US 9,583,530 B2
(45) Date of Patent: Feb. 28, 2017

(54) X-RAY DETECTOR (75) Inventors: Yuji Tsuji, Hamura (JP); Takuto Sakumura, Hachioji (JP); Shinnichi Ohya, Suginami (JP); Akira Tsukiyama, Hino (JP)

(73) Assignee: RIGAKU CORPORATION, Tokyo (JP)

( * ) Notice: Subject to any disclaimer, the term of this patent is extended or adjusted under 35 U.S.C. 154(b) by 743 days.

(21) Appl. No.: 13/337,859

(22) Filed: Dec. 27, 2011

(65) Prior Publication Data

US 2012/0161019 A1 Jun. 28, 2012

(30) Foreign Application Priority Data

Dec. 27, 2010 (JP) ................................. 2010-289678

(51) Int. Cl.
*G01T 1/24* (2006.01)
*H01L 27/146* (2006.01)
*H01L 31/02* (2006.01)
*H01L 31/0203* (2014.01)

(52) U.S. Cl.
CPC .. *H01L 27/14658* (2013.01); *H01L 27/14618* (2013.01); *H01L 31/0201* (2013.01); *H01L 31/0203* (2013.01); *H01L 2924/0002* (2013.01)

(58) Field of Classification Search
USPC .................................................. 250/370.09
See application file for complete search history.

(56) References Cited

U.S. PATENT DOCUMENTS

| 3,129,329 | A | * | 4/1964 | Love et al. ................... 376/153 |
| 4,181,856 | A | * | 1/1980 | Bone ........................ 250/370.09 |
| 4,744,764 | A | * | 5/1988 | Rubenstein ..................... 439/62 |
| 5,629,524 | A | | 5/1997 | Stettner et al. |
| 7,358,501 | B2 | | 4/2008 | Danzer et al. |
| 7,514,688 | B2 | | 4/2009 | Broennimann et al. |
| 8,025,439 | B2 | | 9/2011 | Yu et al. |
| 2002/0085665 | A1 | * | 7/2002 | Hoffman et al. ............... 378/19 |
| 2003/0164888 | A1 | | 9/2003 | Orava et al. |

(Continued)

FOREIGN PATENT DOCUMENTS

| JP | 2006-276016 A | 10/2006 |
| JP | 2010-185755 A | 8/2010 |

(Continued)

*Primary Examiner* — David Porta
*Assistant Examiner* — Shun Lee
(74) *Attorney, Agent, or Firm* — Birch, Stewart, Kolasch & Birch, LLP (57) ABSTRACT To provide an X-ray detector facilitating the installing and replacement work of a module while reducing the possibility of breakage. An X-ray detector 50 detecting X-ray image data for each detection module includes: a detection module 7 provided with a protruding frame on a back side of a detection device detecting X-rays; and a guide frame 12 fitting into the protruding frame and removably supporting the detection device, wherein the guide frame 12 fixes the position of the detection device relative to the guide frame 12 by fitting. Therefore, fitting the protruding frame 8 into the guide frame 12 enables precise and easy installation/removal of the detection module. That is a detection module can be newly installed onto the guide frame without interfering each other with adjacent detection modules already installed while minimizing a space therebetween.

10 Claims, 11 Drawing Sheets (56) References Cited

U.S. PATENT DOCUMENTS

| | | | |
|---|---|---|---|
| 2005/0157481 A1* | 7/2005 | Barsun et al. | ................ 361/810 |
| 2006/0231767 A1 | 10/2006 | Danzer et al. | |
| 2008/0165921 A1* | 7/2008 | Tkaczyk | ................ A61B 6/032 |
| | | | 378/19 |
| 2009/0218500 A1 | 9/2009 | Broennmann | |
| 2010/0202592 A1 | 8/2010 | Yu et al. | |
| 2012/0097857 A1 | 4/2012 | Hayatsu et al. | |

FOREIGN PATENT DOCUMENTS

| | | |
|---|---|---|
| JP | 2010-278220 A | 12/2010 |
| WO | WO 2007/025605 A1 | 3/2007 |

* cited by examiner

X-RAY DETECTOR

BACKGROUND OF THE INVENTION

Field of the Invention

The present invention relates to an X-ray detector detecting X-ray image data for each module.

Description of the Related Art

A single-photon counting-type detector was originally used as a point sensor in order to verify the presence or absence of X-rays while discriminating energy. In such a detector, information about the incidence direction and position of X-rays was obtained by moving the sensor itself. In the early days, the arrangement of a large number of point sensors involved technical difficulties. However, the progress in semiconductor mounting technologies has made it possible to linearly (one-dimensionally) or planarly (two-dimensionally) arrange sensors and its readout circuits.

Until now, as a radiation detector in place of an X-ray film or an imaging plate, a flat panel detector using a CMOS image sensor, a CCD detector using multiple CCD devices, and the like have been usually used as a detector with a large detection surface. However, each of these is a charge storage type detector in which a detection pixel has a relatively simple structure.

The single-photon counting type detector, unlike the charge storage type detector, can discriminate an incident photon with respect to a specific energy. The single-photon counting type detector is effectively used in particular in analytical methods using X-ray diffraction because it has advantages of no background noise and a wide dynamic range.

In contrast, by two-dimensionally configuring such a detector through the use of a large number of fine pixels, the information about the position, angle and direction of incident X-rays can be extracted as the positional information on the detector without moving a detection sensor. Because of this, a data read rate (frame rate) can be improved significantly.

As the method of configuring such a detector by using multiple pixels, a hybrid method is known. In the hybrid method, for example, a pixel output terminal of each detection element of a semiconductor device and a pixel input terminal of a readout circuit are connected to each other one by one. This connection is typically made by bump bonding by using a fine solder ball. Thus, the detection element and the readout circuit are produced as separate elements and the both are connected to constitute the detector.

In such a hybrid type detector, for either the detection element or the readout circuit, the semiconductor area that can be formed is limited, and thus it is difficult to integrally form a detection surface having a large area. This is due to the influence of the yield in semiconductor manufacturing, the limit of the available wafer size, and the like. Therefore, by fabricating a detection module of a manufacturable detection area and arranging a plurality of these detection modules, a method is employed for securing a required detection area.

In the hybrid type detector, usually, a detection element and a readout circuit are bump-bonded to each other and the size of a solder ball forming a bump is also extremely small. Therefore, the detector is susceptible to an impact. Moreover, if a detection element surface has a scratch, accurate detection cannot be performed, and thus the detection element surface itself needs to avoid the handling causing a scratch or the like. Furthermore, since wire bonding may be performed on the readout circuit, for example, a special care needs to be taken for handling at the time of assembling with respect to a detection portion.

As such a hybrid type detector, US Patent Application Publication No. 2009/0218500 specification (Patent Document 1) discloses a detector, in which an X-ray detection module is held by a frame. This frame is provided with equally spaced rails for the purpose of securing the flatness of the detection region and securing a relative position with regard to the arrangement of each individual module. In addition, U.S. Pat. No. 7,514,688 (Patent Document 2) refers to a sensor module made up of N×M array of photo detection diodes and N×M array of readout unit cells and to an imaging device in which these modules are arranged in a V×W array.

However, when attempting to arrange N×M detection modules on the frame described in Patent Document 1, the work load increases. For example, in installing the modules starting from a module at a corner of the top end, each of the adjacent modules has to be installed while being positioned.

Moreover, in replacing a module located in the middle, only this module cannot be removed. After starting to remove modules from one end and once removing a large number of modules, a target module has to be removed. Also in this case, naturally, after the removal and replacement of a module, another module has to be removed while positioning the same again.

Even the detector described in Patent Document 2 cannot resolve the above-described problem. Patent Document 2 does not clearly state a specific method of installing each module. Therefore, in the conventional art, in arranging and installing N×M modules at the beginning and in removing and reinstalling any module after the arrangement, the workability decreases significantly.

In contrast, the detection region in such a detection module is a photodiode surface of a semiconductor, and is usually subjected to metal evaporation in order to apply an electric field for detection. Examples of typical metals used in evaporation include aluminum. The photodiode itself is thin (typically, several hundred μm) and is susceptible to a mechanical stress. Although bump bonding may be performed between a photodiode and a readout element, each individual bump itself in this case is extremely small (typically, several ten μm) and is also is susceptible to a mechanical stress.

In view of such circumstances, great care is required in handling a portion from a detection region to a readout element. In the detector described in the above-described Patent Documents, neither a countermeasure to protect the detection surface of a module during installing work of the module nor a countermeasure in terms of mechanism for avoiding breakage or failure caused by bringing the modules into contact with each other is implemented.

SUMMARY OF THE INVENTION

The present invention has been made in view of the above circumstances and an object of the present invention is to provides an X-ray detector facilitating the installing and replacement works of a module while reducing the possibility of breakage.

(1) In order to achieve the above-described object, an X-ray detector according to the present invention is an X-ray detector detecting X-ray image data for each detection module, including: a detection module provided with a protruding frame on a back side of a detection device detecting X-rays; and a guide frame fitting into the protruding frame and removably supporting the detection device, in which the guide frame fixes a position of the detection device relative to the guide frame by the fitting.

Because of this, fitting the protruding frame into the guide frame enables precise and easy installation/removal of the detection module. That is a detection module can be newly installed onto the guide frame without interfering each other with adjacent detection modules already installed while minimizing a space therebetween, and interference with the adjacent detection modules can be prevented also at the time of removal. Moreover, a detection module at any position can be inserted/removed easily.

(2) In addition, in the X-ray detector according to the present invention, the guide frame includes a window hole fitting the protruding frame thereinto, and a guide groove slidably holding the protruding frame is formed in the window hole. Because of this, sliding the protruding frame along the guide groove of the window hole enables easy and precise installation/removal of the detection module.

(3) Furthermore, in the X-ray detector according to the present invention, the protruding frame and the guide groove are formed so as to be able to fit/remove the detection device by sliding the detection device in a direction perpendicular to the detection surface. Because of this, the protruding frame is more easily fit into the guide frame, and the positioning of the detection surface is also facilitated.

(4) Moreover, in the X-ray detector according to the present invention, a handle portion is formed at one end of the protruding frame. This enables grabbing and pulling in or pushing out the handle portion, and thus the contact to the detection device, which requires care in handling, can be prevented. Moreover, also the case can be dealt with easily, where a force is required in pulling in the handle portion.

(5) In addition, in the X-ray detector according to the present invention, the detection module transmits a detection signal by means of a flexible wiring board connected to the detection device. This enables connecting multiple signal lines to the detection device including a large number of pixels.

(6) Furthermore, in the X-ray detector according to the present invention, the flexible wiring board is folded so as to wrap around an end in a shorter direction of a main surface of a detection surface plate supporting the detection device. This enables reduction of a dead space in which there is no detection surface, as much as possible and enables configuring a highly efficient X-ray detector.

(7) Moreover, in the X-ray detector according to the present invention, the detection module further includes a readout circuit substrate provided by being connected to the flexible wiring board on the protruding frame, the readout circuit substrate reading image data from the detection device. Thus, the flexible wiring board and the readout circuit substrate can be connected to each other with high-density signal wirings.

(8) In addition, in the X-ray detector according to the present invention, the readout circuit substrate is connected to the flexible wiring board via a connector. Thus, the flexible wiring board and the detection device fixed thereto can be replaced easily while being separated from other portions of the detection module.

(9) Furthermore, in the X-ray detector according to the present invention, the readout circuit substrate is connected to the flexible wiring board by an anisotropic conductive film. This can facilitate the connection between the detection device and multiple signal lines, and thus the connection portion can be compactly configured.

(10) Moreover, in the X-ray detector according to the present invention, the detection device includes a detection element made up of a photodiode and a readout element, and the detection element and the readout element are bump-bonded to each other, and the readout element and the flexible wiring board are connected to each other by wire bonding as signal lines. Therefore, in the configuration of the detection device suitable for a photon counting method, the installation and removal of the detection module becomes facilitated.

(11) In addition, in the X-ray detector according to the present invention, the detection module and the guide frame each include a positioning hole at positions facing each other at the time of installing, whereby these can be positioned by means of a guide pin. This enables the positioning by means of a guide pin and enables the positioning by a simple operation at the time of the installing the detection module.

(12) Furthermore, in the X-ray detector according to the present invention, the detection module and the guide frame each include a screw hole on one of surfaces facing each other at the time of installing, whereby these can be positioned by means of a screw. This enables positioning of the X-ray detection surface to a predetermined position more precisely.

(13) Moreover, in the X-ray detector according to the present invention, the protruding frame is rectangular and tabular, and a readout circuit substrate is provided on both main surfaces thereof. This enables high-density signal wiring, and thus the X-ray detection efficiency can be improved.

According to the present invention, for an X-ray detector detecting X-ray image data for each detection module, the installing and replacement work of the module are facilitated while reducing the possibility of breakage.

DETAILED DESCRIPTION OF THE INVENTION

Next, embodiments of the present invention will be described with reference to the accompanying drawings. For ease of understanding of the description, in each drawing, the same reference numeral is attached to the same component, and the repeated explanation thereof is omitted.

[First Embodiment]

(X-Ray Detector)

Figure 1:
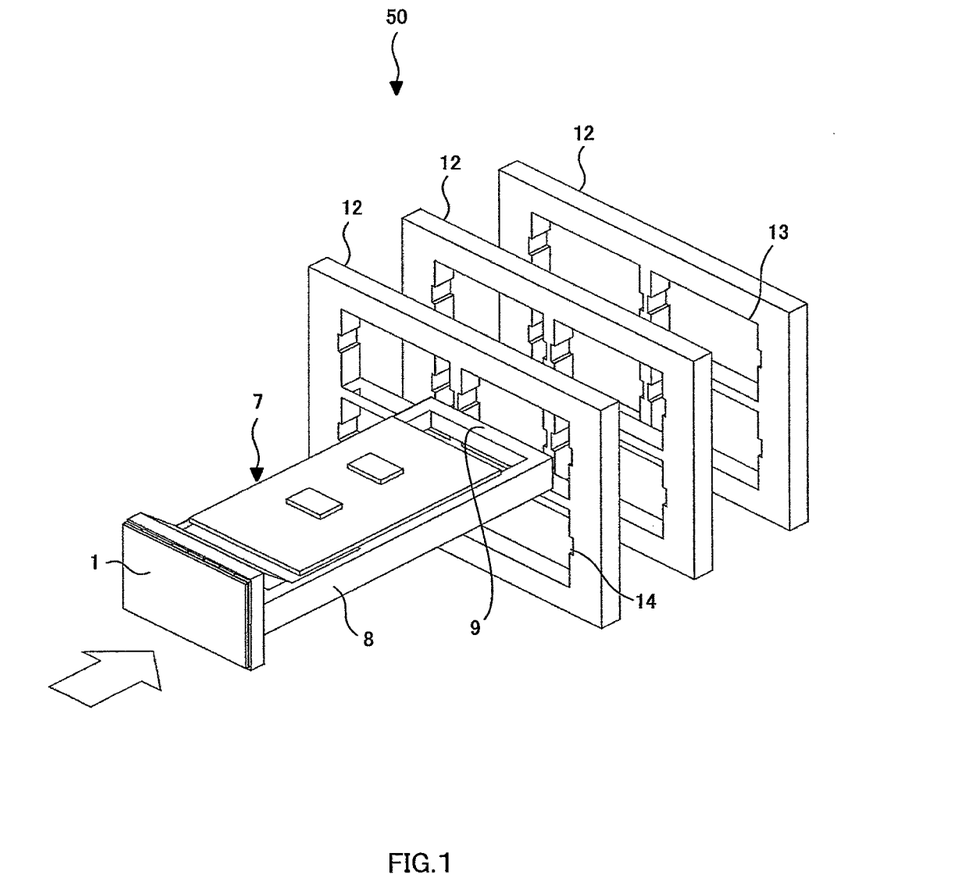
FIG. 1 is a perspective view showing an X-ray detector according to the present invention.

FIG. 1 is a perspective view showing an X-ray detector 50. The X-ray detector 50 is an X-ray imaging detector, and includes a large number of pixels, and has a structure capable of holding and expanding a detection area. The X-ray detector 50 is used, for example, for single crystal structure analysis by X-ray diffraction. As shown in FIG. 1, the X-ray detector 50 includes a detection module 7 and a guide frame 12, and detects X-ray image data for each detection module 7.

(Detection Module)

Figure 2:
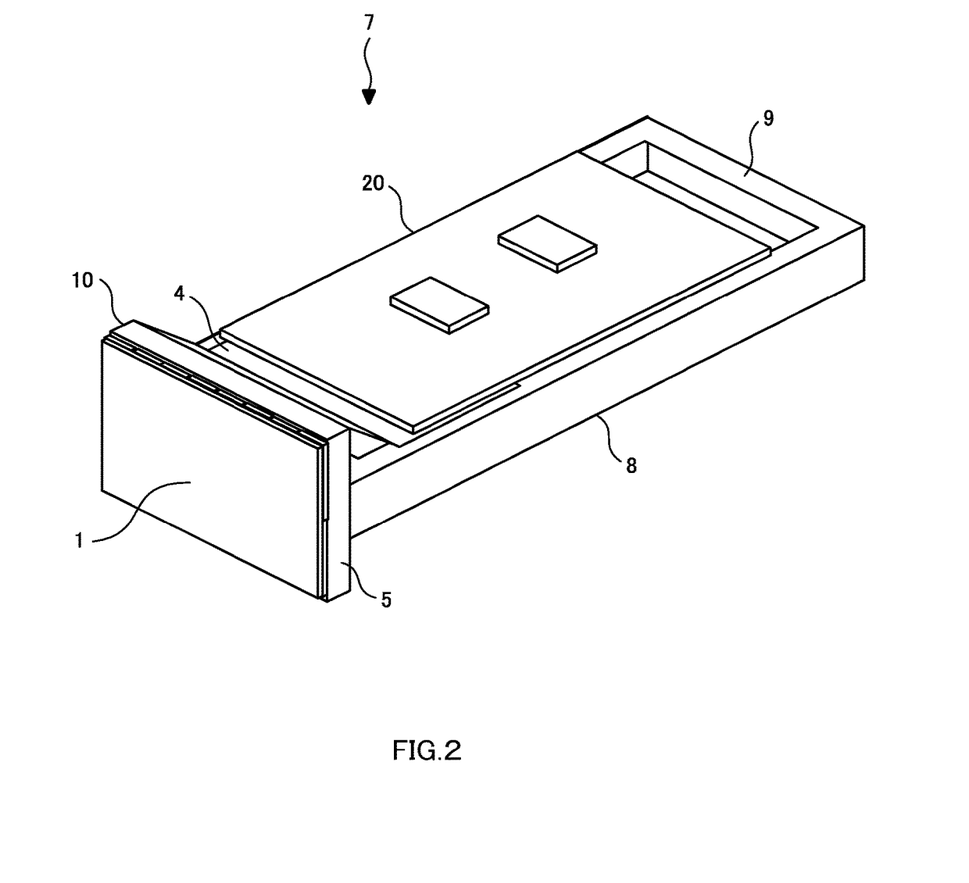
FIG. 2 is a perspective view showing a detection module.
Figure 3:
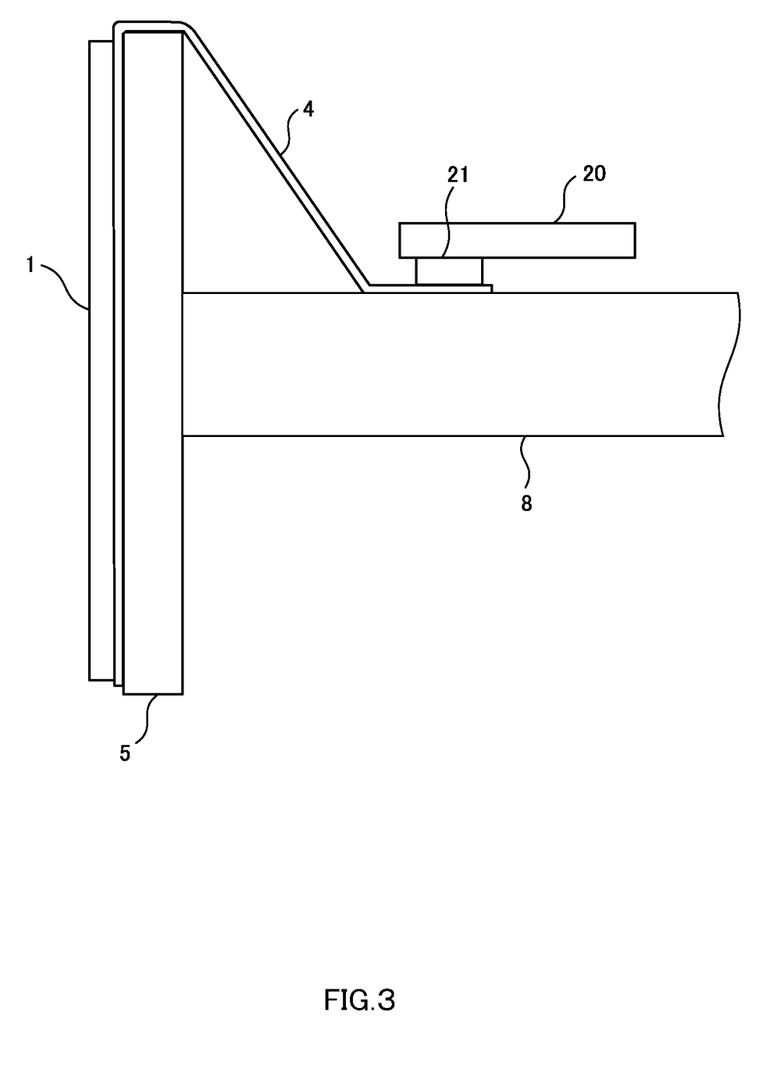
FIG. 3 is a side view showing the detection module.

FIG. 2 is a perspective view showing the detection module 7, and FIG. 3 is a side view showing the detection module. The detection module 7 includes a detection device 1, a detection surface plate 5, a protruding frame 8, a flexible wiring board 4, a readout circuit substrate 20, and a handle portion 9.

The detection device 1 includes a large number of single-photon counting type pixels, detects X-rays, and digitizes and holds detected data. The detection device 1 is fixed onto one side of the detection surface plate 5. A protruding frame 8 of a rectangular and tabular shape is provided on the other side the detection surface plate 5.

Figure 8:
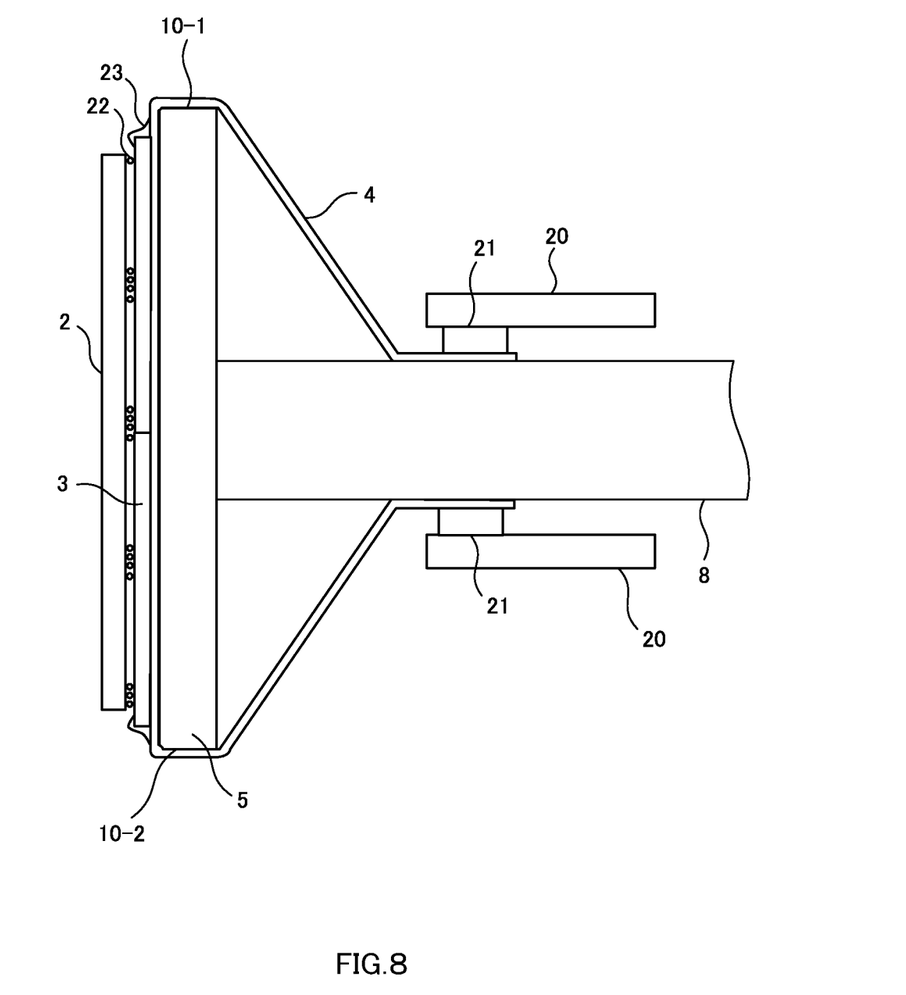
FIG. 8 is an enlarged side view showing a detection module.

As shown in FIG. 8, the device 1 includes a detection element made up of a photodiode and a readout element, and a detection element 2 and a readout element 3 are bonded to each other with bump-bonding 22, and the readout element 3 and the flexible wiring board 4 are connected to each other with wire bonding 23 as signal lines. Thus, in the configuration of the detection device 1 suitable for the photon counting method, the installation and removal of the detection module 7 can be facilitated.

The flexible wiring board 4 is coupled to the detection device 1, and is folded so as to wrap around an end 10 of the detection surface plate 5. Then, the flexible wiring board 4 is fixed to the protruding frame 8, and is connected to the readout circuit substrate 20 in the protruding frame 8. By means of the flexible wiring board 4 coupled in this manner, a detection signal is transmitted. Therefore, multiple signal lines can be connected to the detection device made up of a large number of pixels.

The flexible wiring board 4 is folded so as to wrap around the end 10 in a shorter direction of a main surface of the detection surface plate 5 supporting the detection device 1. This can reduce a dead space as much as possible, and thus the highly efficient X-ray detector 50 can be configured.

The readout circuit substrate 20 reads image data from the detection device 1. The readout circuit substrate 20 is mounted on the protruding frame 8, is connected to the detection device 1, and performs the readout and control of data. In this manner, the flexible wiring board 4 and the readout circuit substrate 20 can be connected to each other with high-density signal wirings.

The readout circuit substrate 20 is connected to the flexible wiring board 4 via a connection portion 21. The connection portion 21 can be formed from a connector. In this case, the flexible wiring board 4 and the detection device 1 fixed thereto can be replaced easily while being separated from other portions of the detection module 7. The connection portion 21 may be formed from an anisotropic conductive film. If the anisotropic conductive film is used, the connection between the detection device and multiple signal lines can be facilitated, and thus the connection portion can be compactly configured.

The handle portion 9 is formed at one end of the protruding frame 8. This enables grabbing and pulling in or pushing out the handle portion 9, and thus the contact to the detection device 1, which requires caution in handling, can be prevented.

(Guide Frame)

Figure 5:
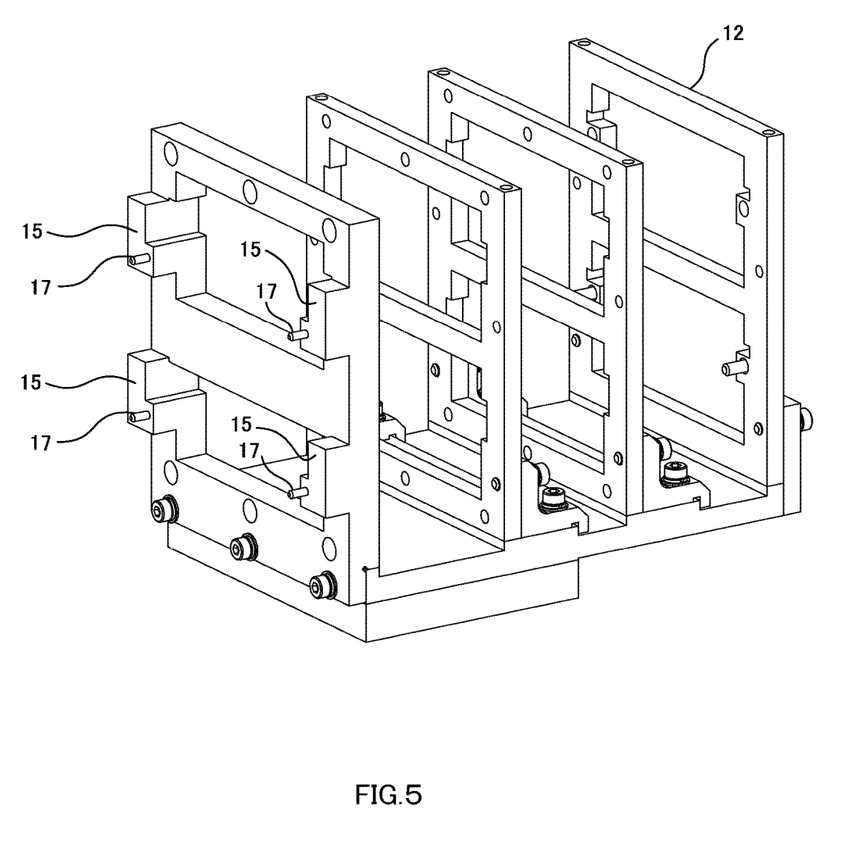
FIG. 5 is a perspective view showing the guide frame.

A plurality of guide frames 12 is integrally configured with mutual relative positions fixed. The guide frame 12 is fixed after aligning the positional relationship with a non-illustrated separate structure. Moreover, not a plurality of guide frames 12 but an integrated guide frame 12 may be configured. The guide frame 12 fits into the protruding frame 8 and removably supports the detection module 7. Then, the position of the detection device 1 relative to the guide frame 12 is fixed.

The guide frame 12 includes a window hole fitting into the protruding frame 8. A guide groove slidably holding the protruding frame 8 is formed in the window hole. In contrast, the protruding frame 8 is provided perpendicular to the detection surface with respect to the detection surface plate 5, and is formed so as to be able to install/remove the detection module 7 to/from the guide frame 12 by sliding the detection surface in the direction perpendicular to the detection surface.

The protruding frame 8 serves both as a rail assisting insertion into the guide frame 12, into which the detection module 7 is inserted, and as a handle for pulling in the detection module 7. Thus, the protruding frame 8 can be more easily fit into the guide frame 12, and the positioning of the detection surface is also facilitated.

Then, the detection module 7 can be newly installed onto the guide frame 12 without interfering each other with adjacent detection modules 7 already installed while minimizing a space therebetween. Also in removing the detection module 7, the influence on the adjacent detection modules 7 can be prevented. Moreover, the detection module 7 at a given position can be inserted/removed easily. As a result, it is possible not only to improve workability, however also to narrow the interval between the detection modules 7 as much as possible and reduce a dead space in detection.

(Guide Pin)

Figure 4:
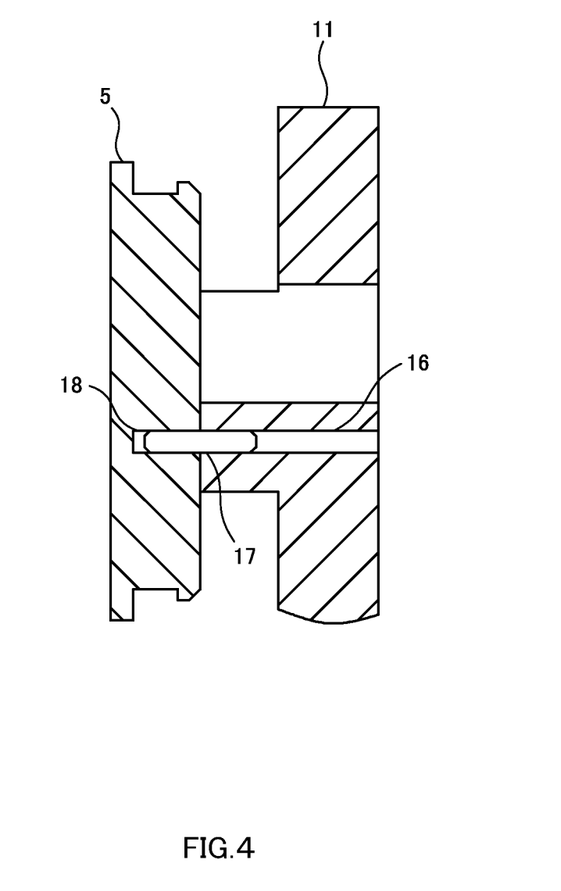
FIG. 4 is an enlarged cross-sectional view of a connection portion between the detection module and a guide frame.
Figure 6:
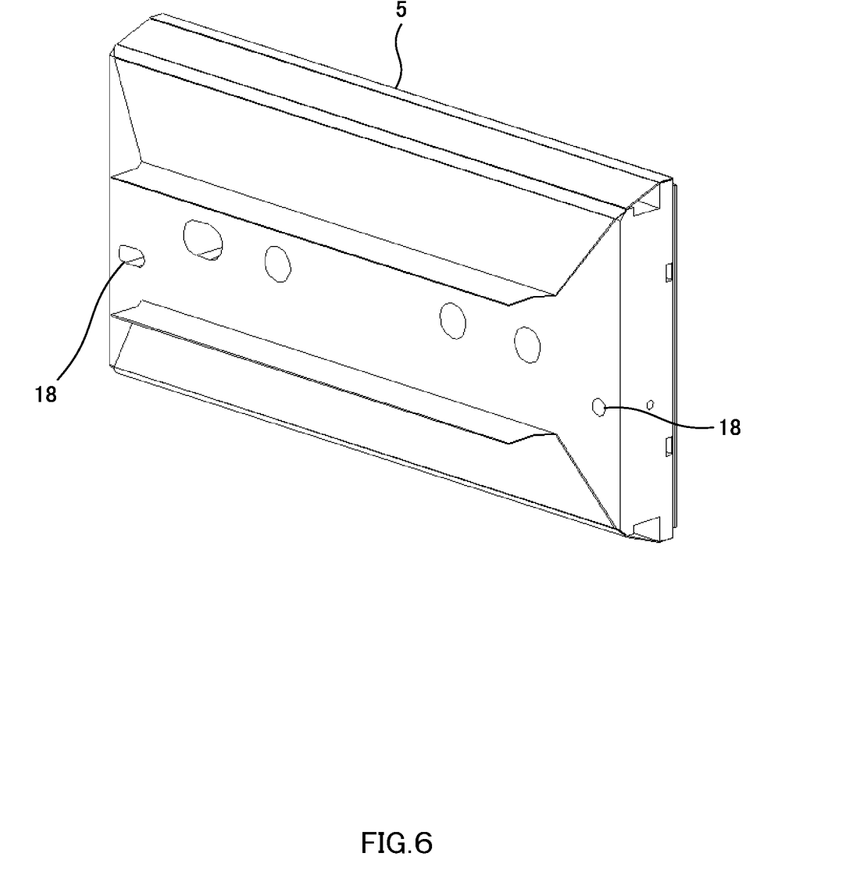
FIG. 6 is a perspective view showing a detection surface plate.

FIG. 4 is an enlarged cross-sectional view of a connection portion between the detection module 7 and the guide frame 12. FIG. 5 is a perspective view showing the guide frame 12. FIG. 6 is a perspective view showing the detection surface plate 5. In the example shown in FIG. 4, a positioning hole 18 is provided in the detection surface plate 5 and a positioning hole 16 is provided in a foremost front plate 11, respectively. Then, a guide pin 17 is used for positioning and fixing the positioning holes 16 and 18. It should be noted that, by increasing, through machining in advance, the accuracy of a contact surface 15 of the foremost front plate 11 of the guide frame 12 facing the back side of the detection surface plate 5, the accuracy in the depth direction of each detection module can be improved. Taking such a method enables the positioning with a simple insertion/removal operation of the detection module 7.

The detection module 7 and the foremost front plate 11 of the guide frame 12 each include the positioning hole at the positions facing each other, whereby these can be positioned by means of the guide pin 17. This enables the positioning by the guide pin 17 and enables the positioning by a simple operation at the time of the installation of the detection module 7. The guide pin may have an adjustment function of enabling fine adjustment of the X-ray detection surface. This enables positioning of the X-ray detection surface to a predetermined position more precisely.

(Installation of the Detection Module)

Figure 7:
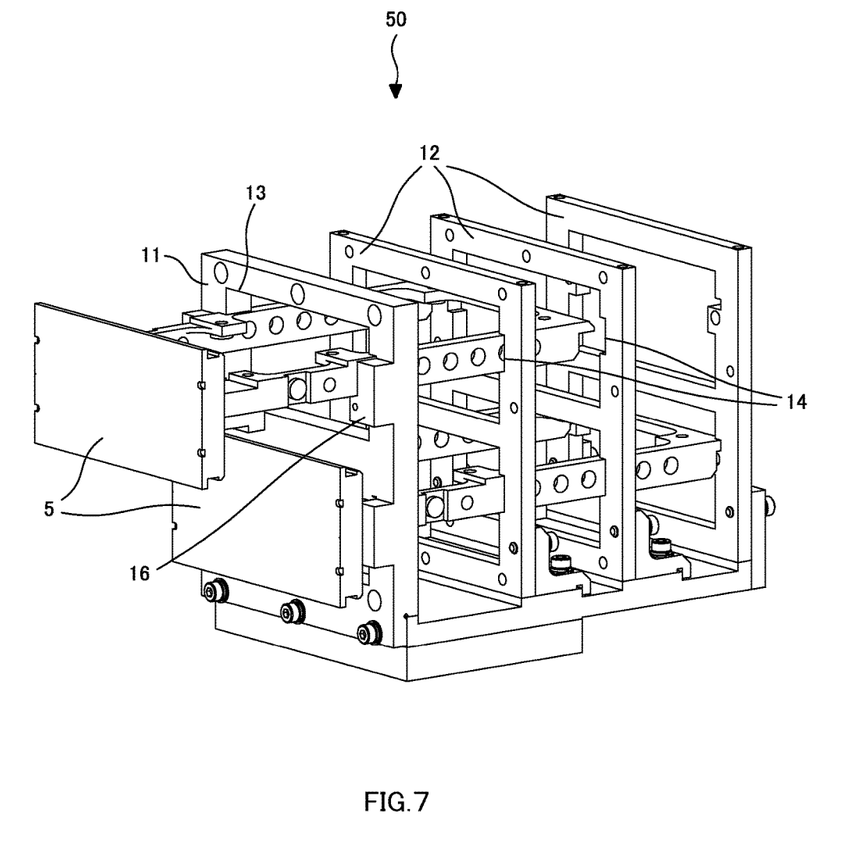
FIG. 7 is a perspective view showing a part of the X-ray detector according to the present invention.

FIG. 7 is a perspective view showing a part of the X-ray detector 50. As shown in FIG. 7, a user fits the protruding frame 8 into the guide groove 14 through the window hole 13 of the guide frame 12, and then pulls in the detection module 7 while sliding the detection module 7 with the handle portion 9. By employing a structure in which the protruding frame 8 and the window hole 13 fit together, the detection module 7 can be installed without the detection modules 7 contacting each other during the work of installing. It should be noted that, in FIG. 7, the detection device 1, the flexible wiring board 4, and the readout circuit substrate 20 are omitted, and an embodiment for housing the detection module 7 is simplified and shown.

Moreover, in the detection device 1 of each detection module 7, the photodiode constituting the sensor and a bonding wire used for reading a signal are bared. The sensor portion itself is also connected to the detection device 1 by bump bonding using a fine solder bump. Accordingly, the detection module 7 needs to be installed by avoiding all actions such as pushing or touching the detection surface. Against a casing made up of the guide frame 12, a user grabs the handle portion 9 and pulls in and fits each detection module 7.

[Second Embodiment]

Figure 9:
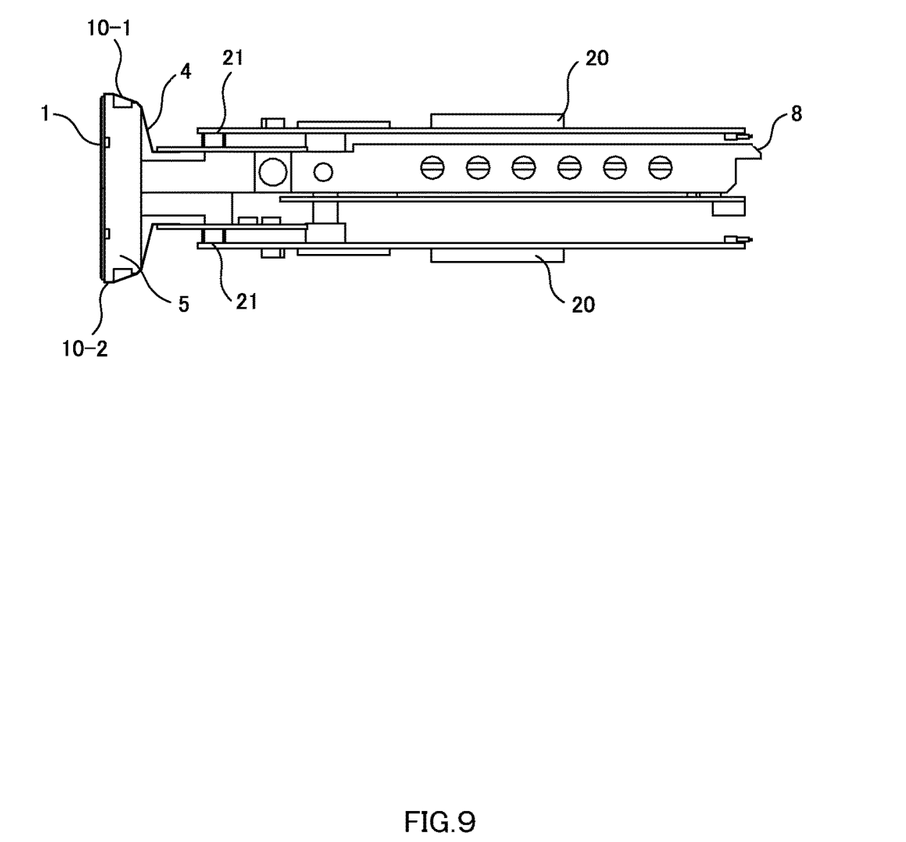
FIG. 9 is a side view showing the entire detection module.

In the above-described embodiment, the readout circuit substrate 20 is provided only on one of the main surfaces of the protruding frame 8, however the readout circuit substrate 20 may be provided on both the main surfaces. FIG. 8 is an enlarged side view showing a detection module. FIG. 9 is a side view showing the entire detection module. The flexible wiring board 4 is folded so as to wrap around both ends 10-1 and 10-2 of the detection surface plate. The readout circuit substrate 20 is provided on both the main surfaces of the protruding frame 8, and the flexible wiring board 4 is connected to the readout circuit substrate 20 via the connection portion 21. This enables high-density signal wiring, and thus the X-ray detection efficiency can be improved.

[Third Embodiment]

Figure 10:
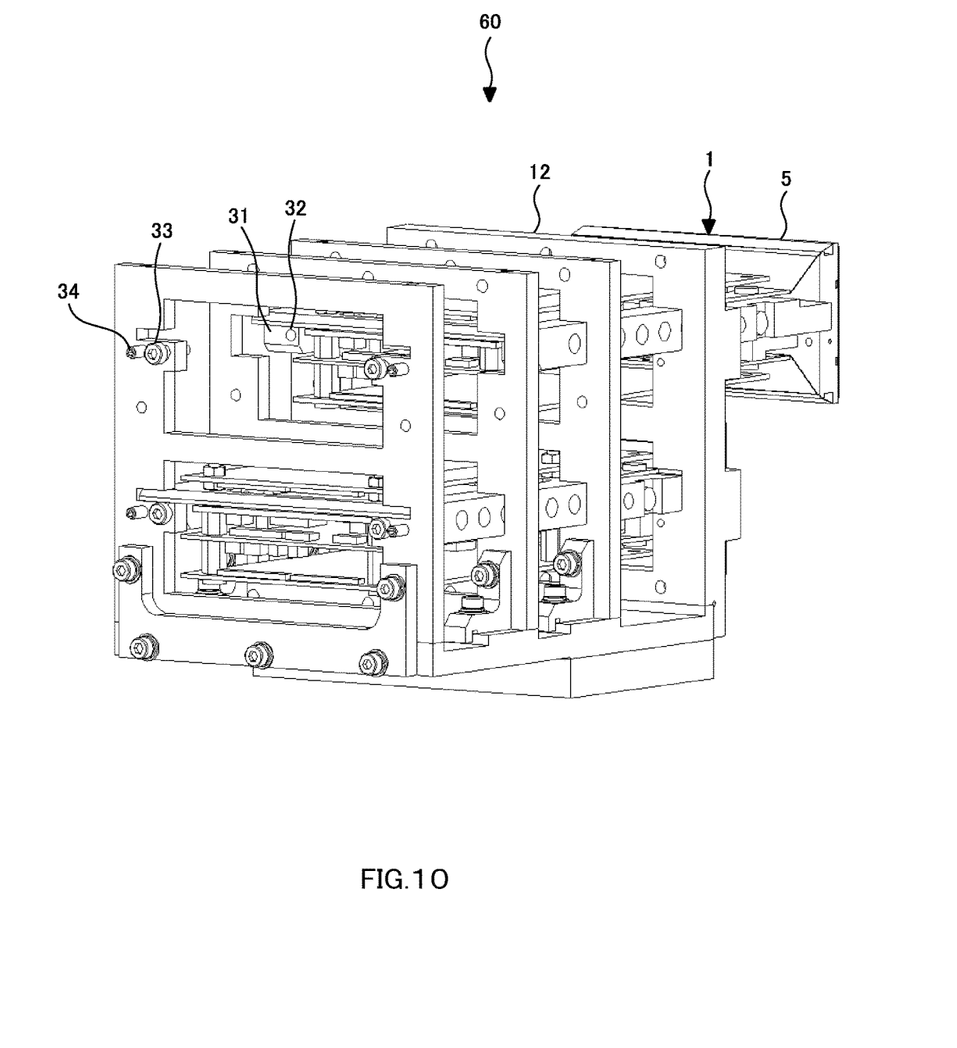
FIG. 10 is a perspective view showing an X-ray detector according to the present invention.
Figure 11:
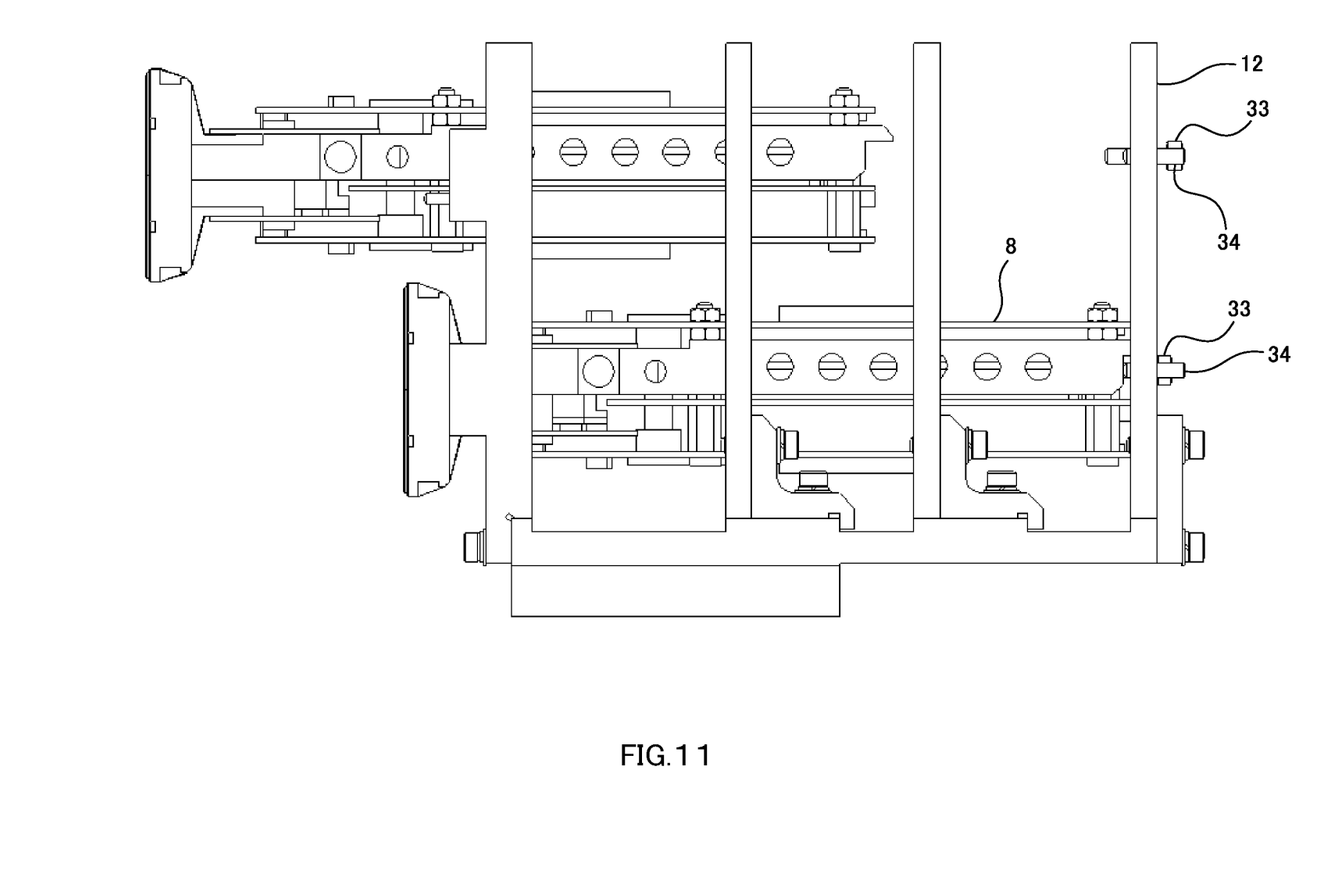
FIG. 11 is a side view showing a part of the X-ray detector according to the present invention.

In the above-described embodiment, the guide pin 17 is provided on a contact surface between the detection module 7 and the guide frame 12 so as to facilitate the positioning of the detection module 7, however an adjusting pin may be provided so as to enable fine adjustment of the positioning. FIG. 10 is a perspective view showing an X-ray detector 60. FIG. 11 is a side view showing a part of the X-ray detectors 60. Although the basic structure of the X-ray detector 60 is the same as that of the X-ray detector 50, the X-ray detector 60 has, in the guide frame, a positioning mechanism by means of a fixing screw 33 and a positioning mechanism by means of an adjustment screw 34.

In contrast, on the back side of the detection surface plate 5, a hole 32 with a threaded groove is formed at a position facing the fixing screw 33. Therefore, the positioning can be performed easily. A hole is not formed at a position facing the adjustment screw 34 on the back side of the detection surface plate 5, and thus the position of the detection surface can be finely adjusted while abutting the adjustment screw 34 against the back side of the detection surface plate 5.

That is, pushing a tip surface 31 of the protruding frame with the adjustment screw 34 enables fine adjustment of the position, and pulling in and fixing the detection module 7 with the fixing screw 33 enables precise positioning of the detection module 7. Pushing out with each other by the both screws enables position adjustment and precise positioning and fixing.

What is claimed is:

1. An X-ray detector detecting X-ray image data for each detection module, comprising:
   a detection module provided with a protruding frame for supporting a readout circuit substrate on a back side of a detection device detecting X-rays; and
   a plurality of guide frames provided adjacent to one another with a space in between, each guide frame including a window hole fitting the protruding frame thereto and removably supporting the detection device, the window hole having a closed cross-section so that the window hole surrounds the protruding frame inserted through the window hole, wherein
   the plurality of guide frames fixes a position of the detection device relative to the guide frame by the fitting,
   a first end of the protruding frame is attached to the back side of the detection device, and a second end, opposite to the first end, of the protruding frame extends beyond the readout circuit substrate, and a handle portion is formed at the second end,
   a guide groove slidably holding the protruding frame is formed in the window hole so as to be able to fit/remove the detection device by sliding the detection device in a direction perpendicular to a detection surface in such a manner that a user grabs and pulls in or pushes out the handle portion, and the guide frame fixes the position of the detection device with the fitted protruding frame being provided therein, relative to the guide frame, and
   the closed cross-section of the window hole is larger than a cross-section of the handle portion and smaller than a cross-section of the detection device,
   wherein the protruding frame is supported by the guide groove in each of the plurality of guide frames.

2. The X-ray detector according to claim 1, wherein the detection module transmits a detection signal by means of a flexible wiring board connected to the detection device.

3. The X-ray detector according to claim 2, wherein the flexible wiring board is folded so as to wrap around an end in a shorter direction of a main surface of a detection surface plate supporting the detection device.

4. The X-ray detector according to claim 2, wherein the readout circuit substrate is connected to the flexible wiring board on the protruding frame, the readout circuit substrate reading image data from the detection device.

5. The X-ray detector according to claim 4, wherein the readout circuit substrate is connected to the flexible wiring board via a connector.

6. The X-ray detector according to claim 4, wherein the readout circuit substrate is connected to the flexible wiring board by an anisotropic conductive film.

7. The X-ray detector according to claim 2, wherein
   the detection device includes a detection element made up of a photodiode and a readout element, wherein
   the detection element and the readout element are bump-bonded to each other, and wherein
   the readout element and the flexible wiring board are connected to each other by wire bonding as signal lines.

8. The X-ray detector according to claim 1, wherein the detection module has a first positioning hole, and a guide frame, provided most-upstream among the plurality of guide frames with respect to an insertion direction of the detection module, has a second positioning hole that opposes the first positioning hole, and
   wherein a position of the detection module with respect to the guide frame is determined by a guide pin inserted to both the first and second positioning holes.

9. The X-ray detector according to claim 1, wherein the detection module has a hole and a tip end surface at the second end of the protruding frame, and a guide frame, provided most-downstream among the plurality of guide frames with respect to an insertion direction of the detection module, has an adjustment screw that makes contact with the tip end surface and a screw hole accommodating a fixing screw that engages the hole of the detection module, and wherein a position of the detection module with respect to the guide frame is determined by adjusting a position of the adjustment screw, and the detection module is fixed to the guide frame by the fixing screw.

10. The X-ray detector according to claim 1, wherein the protruding frame is rectangular and tabular, and wherein a readout circuit substrate is provided on both main surfaces thereof.

* * * * *